United States Patent [19]
Doi

[11] Patent Number: 6,060,878
[45] Date of Patent: May 9, 2000

[54] SPECTRUM ANALYZER

[75] Inventor: Wataru Doi, Gyoda, Japan

[73] Assignee: Advantest Corp., Tokyo, Japan

[21] Appl. No.: 09/013,652

[22] Filed: Jan. 26, 1998

[30] Foreign Application Priority Data

Feb. 7, 1997 [JP] Japan ................................ 9-025156

[51] Int. Cl.[7] .................................................. H04N 17/00
[52] U.S. Cl. .................................. 324/76.27; 324/76.23; 324/617; 342/20; 73/659
[58] Field of Search ........................ 73/579, 659; 342/20; 324/76.27, 76.23

[56] References Cited

U.S. PATENT DOCUMENTS

| | | | |
|---|---|---|---|
| 2,915,897 | 12/1959 | Hoffman | 324/76.27 |
| 3,110,861 | 11/1963 | Hurvitz | 324/76.27 |
| 5,493,209 | 2/1996 | Gumm | 324/76.27 |

*Primary Examiner*—Josie Ballato
*Assistant Examiner*—Jose M. Solis
*Attorney, Agent, or Firm*—Muramatsu & Associates

[57] ABSTRACT

A spectrum analyzer measures a time difference between two or more signals with different carrier frequencies or a time delay between two or more signals with the same carrier frequency. The spectrum analyzer includes at least two measurement channels, each of the measurement channels has a frequency mixer, a local oscillator and an IF (intermediate frequency) filter for mixing an input signal to be measured with a local signal of the local oscillator to produce an IF signal which passes through the IF filter, and a demodulator provided in one of the measurement channels to demodulate the IF signal produced from the input signal to generate a trigger signal to start an operation of the other measurement channel.

2 Claims, 5 Drawing Sheets

SPECTRUM ANALYZER

FIELD OF THE INVENTION

This invention relates to a spectrum analyzer for analyzing incoming signal in frequency and time domains, and more particularly, to a spectrum analyzer having a plurality of input signal measurement channels each of which operates in synchronism with one another to measure relationship among a plurality of input signals having the same or different carrier frequencies from one another.

BACKGROUND OF THE INVENTION

A basic structure of a frequency spectrum analyzer is shown in FIG. 5. The conventional spectrum analyzer of FIG. 5 includes a frequency mixer 11, a local oscillator 21, an IF (Intermediate Frequency) filter 31, a detector 41, an A/D (Analog-Digital) converter 51, a ramp generator 61, and a signal process and display 81.

The frequency spectrum analyzer of FIG. 5 converts the frequency of an input signal to be analyzed by the frequency mixer 11. The frequency mixer 11 mixes the input signal with a local signal from the local oscillator 21 and produces an IF signal. The local oscillator 21 is driven by a ramp signal from the ramp generator 61 so that the frequency of the local signal varies (sweeps) linearly in response to the ramp signal. The IF filter 31 filters the IF signal to have a predetermined band width. The detector 41 receives the IF signal from the IF filter 31 and produces a DC voltage which is proportional to an AC amplitude of the IF signal. The DC voltage from the detector 41 is converted to a digital signal by the AD converter 51. The digital signal is provided with predetermined data processing by the signal process and display 81 and the result of the data process is displayed on the display screen.

The ramp generator 61 also provides the ramp signal to the AD converter 51 so that the local oscillator 21 and the AD converter 51 interact with each other. The ramp signal from the ramp generator 61 defines a range of the swept frequency of the local oscillator 21, i.e., a span of frequency spectra in the input signal to be measured. The frequency span in this case is a range of frequency shown on a horizonal axis of the display. Thus, when the frequency span has a certain range of frequency relative to the input signal, the frequency spectrum of the input signal is shown on the display as frequency domain data.

When the frequency span is zero, it means that the ramp signal from the ramp generator 61 is set to a fixed voltage so that a frequency of the local signal is fixed and mixed with the input signal. In this situation, what is shown on the horizontal axis of the display is a time domain response of the input signal for a fixed frequency of the local signal. Therefore, a spectrum analyzer is capable of measuring and analyzing the input signal in the frequency domain as well as in the time domain.

The spectrum analyzer may include an external trigger function in which the sweep generator 61 receives a trigger signal from an external source through a trigger input terminal. In this arrangement, the sweep generator 61 generates a ramp signal in synchronism with the trigger signal. Thus, in case where an input signal to be analyzed is a burst signal, by an external trigger signal having a predetermined timing relationship with the start of the burst signal, the spectrum analyzer can effectively analyze the burst signal.

The conventional spectrum analyzer functions as a receiver for measuring an input signal of a single frequency by setting the zero frequency span as noted above. In this setting, the ramp signal from the ramp generator 61 is set to a fixed voltage so that a fixed frequency of the local signal is mixed with the input signal. The local signal frequency is so adjusted that the frequency difference between the local signal and the input signal is always tuned to the center frequency of the IF filter.

An example of application of the zero span mode of the spectrum analyzer is shown in FIGS. 3A wherein signals in a TDMA (Time Division Multiple Access) such as a PHS (Personal Handy Phone System) are illustrated. A reference control channel having a frequency f1 and a communication channel having a frequency f2 are shown in FIG. 3A. In measuring a time difference t1 between the burst signal in the reference control channel and the information A in the communication channel, two receivers (spectrum analyzers), one that is tuned to the frequency f1 to detect a reference timing and the other that is tuned to the frequency f2 to detect the start timing of the information signal, are required.

Further, in the example of FIG. 3A, to synchronize the operation of the two receivers, it is necessary to prepare a trigger extracting circuit to produce a trigger signal from the receiver tuned to the reference channel. The trigger signal is applied to the trigger input terminal of the receiver tuned to the communication channel. Thus, two receivers operate in synchronism with each other.

Another example of measurement application using the zero span mode of the spectrum analyzers is shown in FIG. 4. As shown in a mobile communication system of FIG. 4, a mobile radio transceiver 92 directly receives a transmission signal from a base station 91 through a path 400. The mobile radio transceiver 92 also receives another transmission signal which has been reflected by an object 93 such as a building. To measure a time delay of the reflected transmission signal relative to the direct transmission signal in the situation of FIG. 4, it is necessary to use two receivers (spectrum analyzers), although the frequency in the two signals are the same. One receives the direct transmission signal through a reference antenna and the other receives the reflected transmission signal through a measurement antenna.

As explained in the foregoing, for measuring the time difference between two signals with different frequencies or the time delay between the two signals with the same frequency, two receivers (spectrum analyzers) are necessary. Further, for measuring the time differences between the two signals by the conventional spectrum analyzers, it is necessary to prepare an additional circuit to produce a trigger signal based on the input signal to synchronize the operations between the two spectrum analyzers.

SUMMARY OF THE INVENTION

Therefore, it is an object of the present invention to provide a spectrum analyzer that can measure a time difference between two or more signals with different carrier frequencies or a time delay between two or more signals with the same carrier frequency.

It is another object of the present invention to provide a spectrum analyzer which is capable of performing a plurality of different test items of an input signal in a parallel fashion.

In the first aspect of the present invention, the spectrum analyzer includes at least two measurement channels, each of the measurement channels has a frequency mixer, a local oscillator and an IF (intermediate frequency) filter for mixing an input signal to be measured with a local signal of the local oscillator to produce an IF signal which passes through the IF filter, and a demodulator provided in one of the measurement channels to demodulate the IF signal produced from the input signal to generate a trigger signal to start an operation of the other measurement channel.

In the second aspect of the present invention, the spectrum analyzer includes:

a first measurement channel for measuring a first input signal, comprising:

a first local oscillator for generating a first local signal;

a first frequency mixer for mixing the first input signal to be measured with the first local signal to produce a first IF (Intermediate Frequency) signal;

a first IF filter for allowing the first IF signal from the first frequency mixer to pass therethrough;

a first detector for detecting a first signal representing the first input signal from the first IF filter;

a first AD (Analog-to-Digital) converter for converting the first signal from the first detector to a first digital signal; and a first ramp generator for generating a first ramp signal supplied to the first local oscillator and the first AD converter;

a second measurement channel for measuring a second input signal, comprising:

a second local oscillator for generating a second local signal;

a second frequency mixer for mixing the second input signal to be measured with the second local signal to produce a second IF (Intermediate Frequency) signal;

a second IF filter for allowing the second IF signal from the second frequency mixer to pass therethrough;

a second detector for detecting a second signal representing the second input signal from the second IF filter;

a second AD (Analog-to-Digital) converter for converting the second signal from the second detector to a second digital signal; and a second ramp generator for generating a second ramp signal supplied to the second local oscillator and the second AD converter;

a demodulator for receiving one of the first IF signal from the first IF filter or the second IF signal from the second IF filter for demodulating the IF signal to generate a trigger signal to start a sweep operation of one of the second ramp generator or the first ramp generator to synchronously measure the first and second input signals by the first and second measurement channels; and means for processing said first and second digital signals to calculate measurement results of the first and second input signals and displaying the results.

In the second aspect of the present invention, the spectrum analyzer further includes a selector inserted between the second detector and the second AD converter wherein the selector selects one of the first signal from the first detector or the second signal from the second detector and supplies the same to the second AD converter.

According to the present invention, the spectrum analyzer can measure the time difference among a plurality of input signals having different carrier frequencies or the time delay among a plurality of input signals having the same carrier frequency in the multi-paths environment because a plurality of measurement channels are commonly triggered by a trigger signal produced by a demodulated IF signal of one of the measurement channels to perform synchronized sweep among the measurement channels. Further, the spectrum analyzer can measure input signals quickly because a plurality of different test items for one input signal can be performed in parallel by supplying the signal from the detector to a plurality of AD converters in one sweep operation.

DETAILED DESCRIPTION OF THE PREFERRED EMBODIMENT

The first embodiment of the present invention is explained with reference to FIG. 1.

Figure 1:
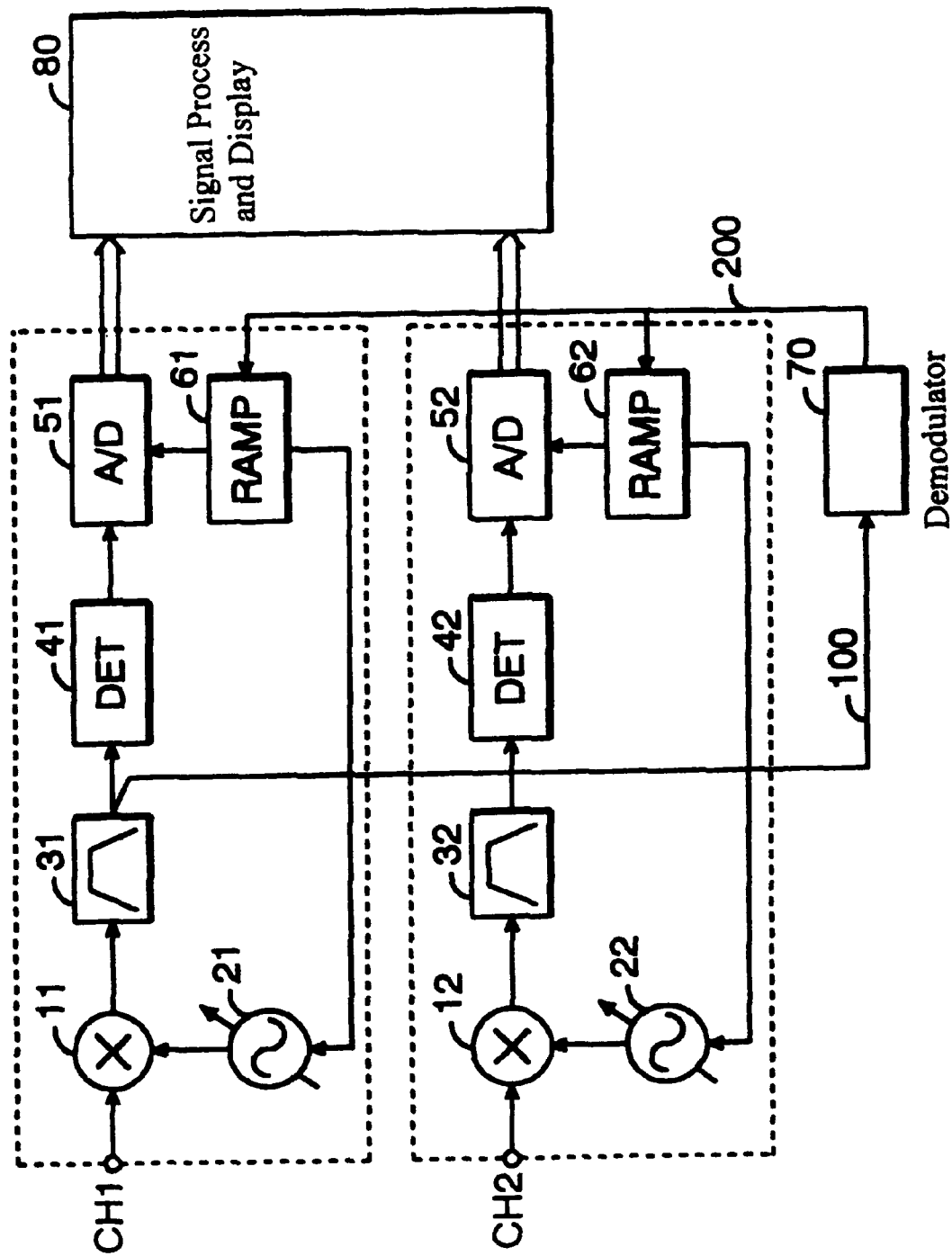
FIG. 1 is a schematic block diagram showing a structure of an embodiment of the spectrum analyzer of the present invention.

The spectrum analyzer of FIG. 1 has two measurement channels CH1 and CH2. As in the conventional spectrum analyzer of FIG. 5, the first measurement channel CH1 includes a frequency mixer 11, a local oscillator 21, an IF (Intermediate Frequency) filter 31, a detector 41, an A/D (Analog-Digital) converter 51, and a ramp generator 61. The second measurement channel CH2 includes a frequency mixer 12, a local oscillator 22, an IF (Intermediate Frequency) filter 32, a detector 42, an A/D (Analog-Digital) converter 52, and a ramp generator 62. A signal process and display 81 receives measured signals from both the first and second measurement channels. The spectrum analyzer also includes a demodulator 70.

Figure 5:
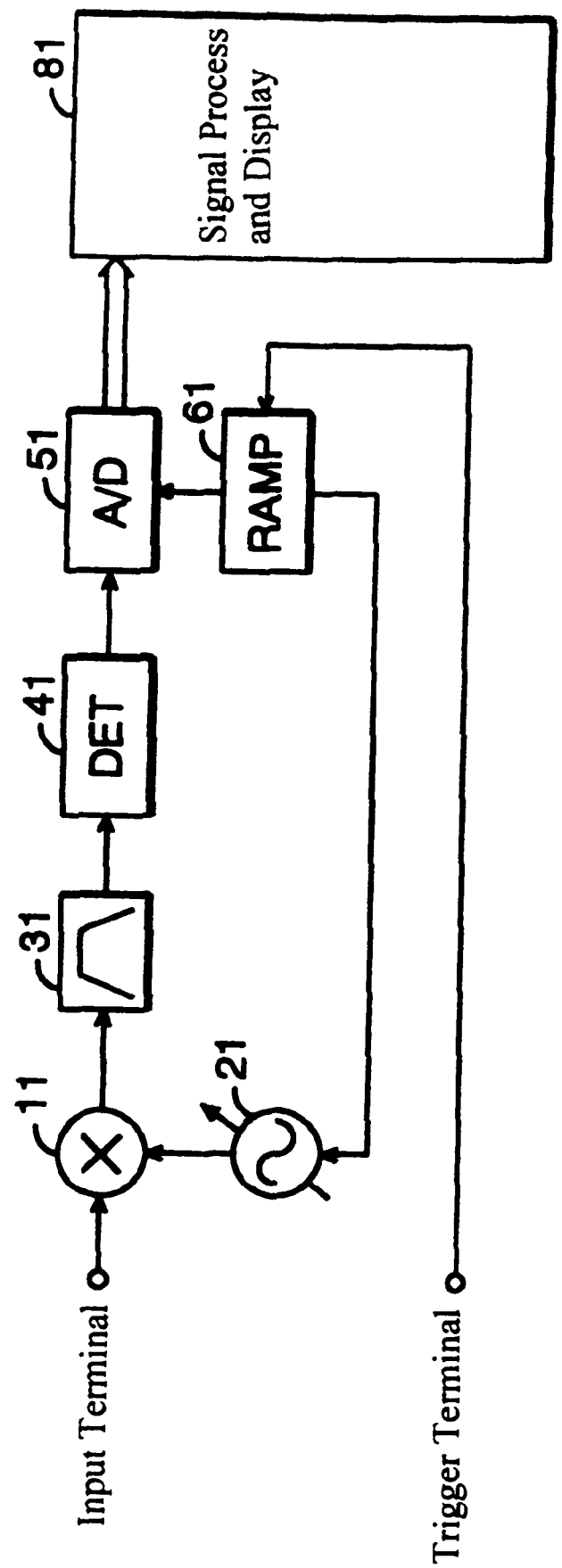
FIG. 5 is a block diagram showing a structure of a conventional spectrum analyzer.

Each of the measurement channels can perform the same functions found in the conventional spectrum analyzer of FIG. 5. Thus, the following description is limited to the operation of the spectrum analyzer where the two measurement channels interact with one another. In the present invention, the spectrum analyzer is capable of operating the one measurement channel in synchronism with a signal in the other measurement channel.

The demodulator 70 has the function to demodulate the received signal, i.e., to extract a signal from a carrier signal, the function of which is similar to a signal detector. The demodulator 70 demodulates an IF signal 100 that is an output of the IF filter 31 in the first measurement channel CH1 to generate a trigger signal 200. The trigger signal 200 synchronizes the operation of the ramp generators 61 and 62.

Figure 3A:
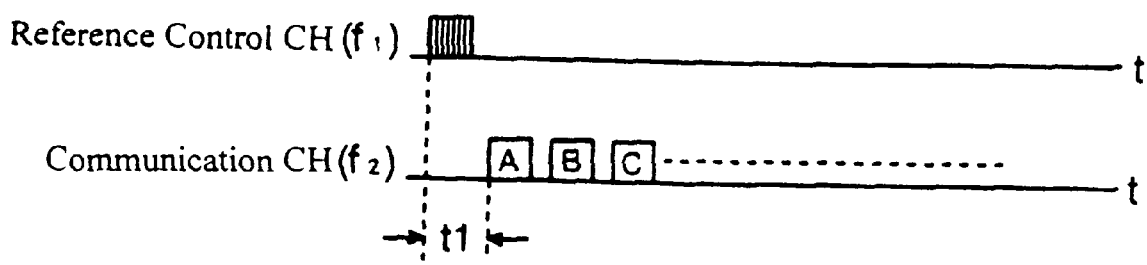
FIG. 3A is a diagram showing an example of waveforms in a PHS communication system.

The operation of the present invention in measuring the time delay t1 in FIG. 3A is as follows. The time delay t1 is a time difference between the communication channel information A of a carrier frequency f2 and the reference control channel of a carrier frequency f1. The input terminal of the first measurement channel CH1 receives the reference control channel signal. The local frequency in the first channel CH1 is adjusted and set to the zero span so that the IF signal is always produced at the center frequency of the IF filter 31. The input terminal of the second measurement channel CH2 receives the communication channel signal. The local frequency in the second channel CH2 is adjusted and set to the zero span so that the IF signal is always produced at the center frequency of the IF filter 32.

Figure 3B:
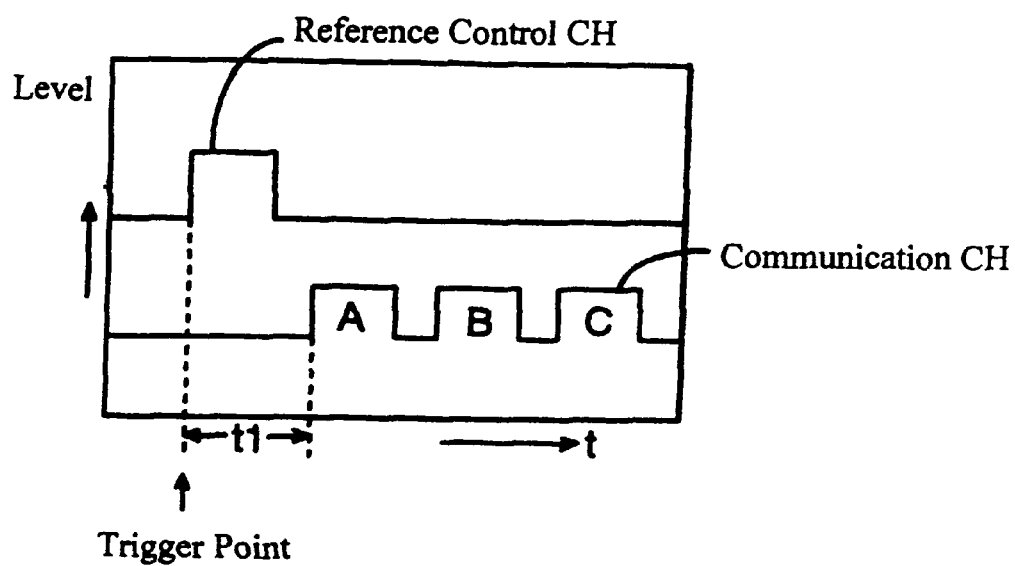
FIG. 3B is a diagram showing an example of time domain waveforms in the PHS communication system.

Consequently, the reference control channel signal and the information A, B and C in the communication channel are respectively expressed by envelop waveforms of FIG. 3B. Hence, examining the detected signals in the measurement channels CH1 and CH2 by simultaneously sweeping the AD converters 51 and 52 and the horizontal axis of the signal process and display 81, the spectrum analyzer can measure the time delay t1 in the time domain.

Figure 4:
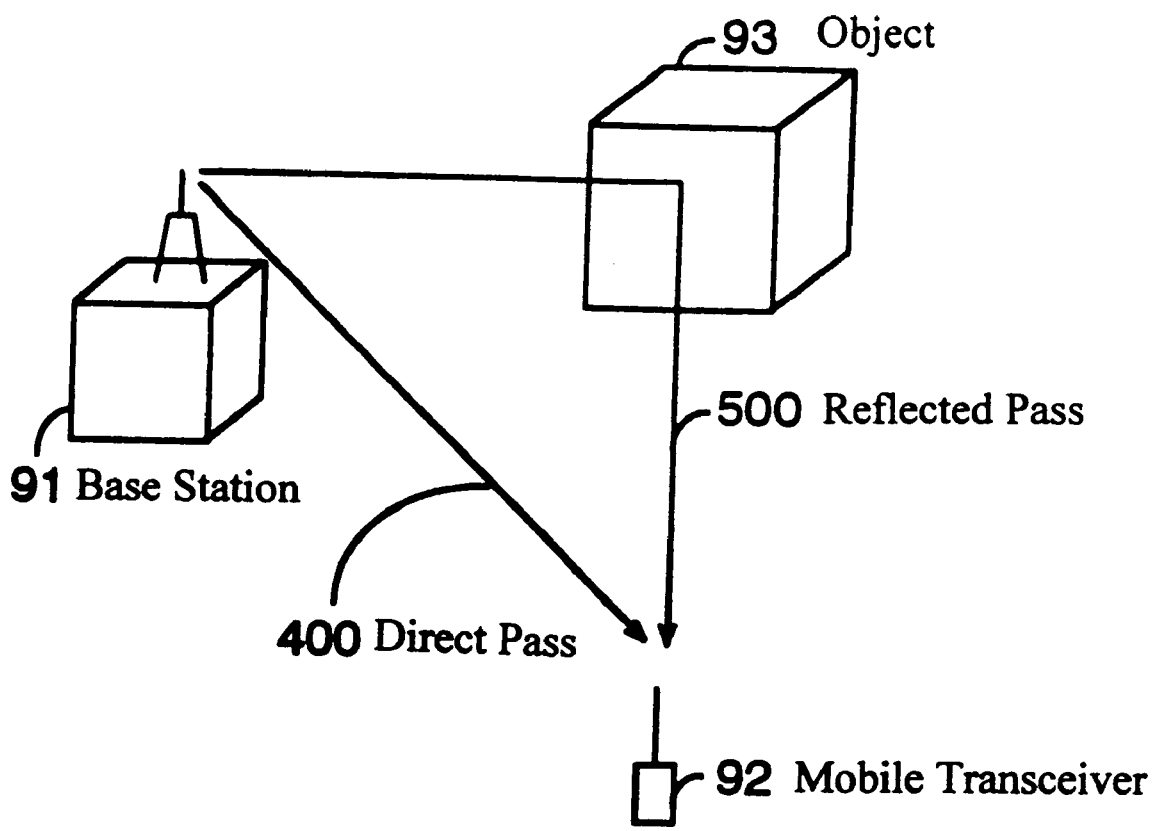
FIG. 4 is a schematic diagram showing a situation where multiple signal paths are created in a mobile communication system.

The operation of the present invention in measuring the time delay t1 between the plurality of signals of the same frequency shown in FIG. 4 is as follows. A reference antenna and a measurement antenna are respectively prepared at the position of the mobile radio transceiver 92. The reference antenna is connected to the input terminal of the first measurement channel CH1 and the measurement antenna is connected to the input terminal of the second measurement channel CH2.

The respective local frequencies are adjusted and fixed to receive the input signals in the zero span mode. By triggering the sweep operations in the AD converters in both channels and the horizontal axis of the signal process and display 81, the time delay between the direct path 400 and the reflected path 500 is displayed in the time domain.

In the above explanation, the spectrum analyzer of the present invention enables the synchronized sweep between the two measurement channels based on the signal in one of the channels. However, the spectrum analyzer of the present invention is not limited to two channels but can be formed of three or more measurement channels.

Figure 2:
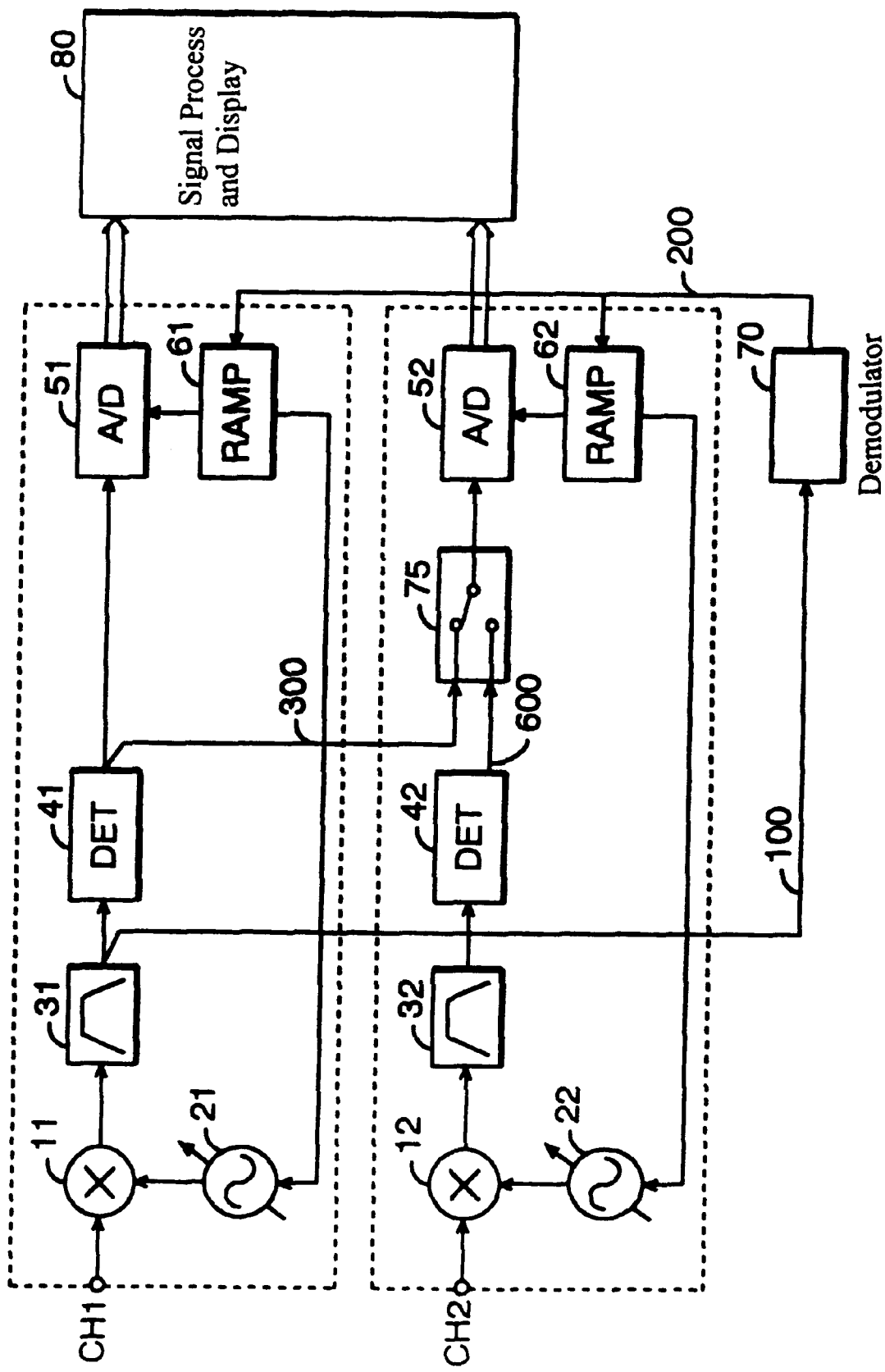
FIG. 2 is a schematic block diagram showing a structure of another embodiment of the spectrum analyzer of the present invention.

FIG. 2 shows the second embodiment of the present invention. In this example, a selector 75 is provided before the A/D converter 52 in the second measurement channel CH2. Thus, the selector 75 selectively supplies either a detected signal 300 from the detector 41 or a detected signal 600 from the detector 42 to the AD converter 52.

By selecting the detected signal 300 by the selector 75, both of the A/D converters 51 and 52 receive the detected signal 300 from the detector 41 at the same time in a parallel form. Therefore, the input signal to the spectrum analyzer can be analyzed by two different test items at the same time in one sweep operation. Thus, the test time is reduced in the application of this invention since the spectrum analyzer in the conventional technology requires to sweep two times when different two test items have to be performed. Therefore, a high test throughput which is two times faster than the conventional example can be achieved. In this embodiment, it is not necessary to limit to the two measurement channels but three or more measurement channels are also possible. In such a situation, the measurement throughput will further increase accordingly.

Each of the embodiments in the foregoing includes only a single stage of the frequency mixer and the IF filter for simplicity of explanation. However, the present invention is feasible in the spectrum analyzer of multiple stages of frequency mixers and IF filters.

Although the foregoing explanation is made for the examples of synchronized sweep function, each measurement channel can function in an asynchronous manner by having a demodulator separately at each measurement channel. The function in this case is similar to the situation where a plurality of separate spectrum analyzers are used. Relative comparison of measurement data is effective because the data processing is carried out in the same condition among the plurality of measurement channels.

The present invention achieves the following effects due to the configuration described above.

The spectrum analyzer can measure the time difference among a plurality of input signals having different carrier frequencies or the time delay among a plurality of input signals having the same carrier frequency in the multi-paths environment because the plurality of measurement channels are commonly triggered by a trigger signal produced by a demodulated IF signal of one of the measurement channels to perform synchronized sweep among the measurement channels. In another aspect of the present invention, the spectrum analyzer can measure input signals quickly because plurality of different test items for a common input signal can be performed in a parallel fashion by supplying the detected signal from the detector to a plurality of AD converters in one sweep operation.

What is claimed is:

1. A spectrum analyzer comprising:
   a first measurement channel for measuring a first input signal, comprising:
     a first local oscillator for generating a first local signal;
     a first frequency mixer for mixing the first input signal to be measured with the first local signal to produce a first IF (Intermediate Frequency) signal;
     a first IF filter for allowing the first IF signal from the first frequency mixer to pass therethrough;
     a first detector for detecting a first signal representing the first input signal from the first IF filter;
     a first AD (Analog-to-Digital) converter for converting the first signal from the first detector to a first digital signal; and
     a first ramp generator for generating a first ramp signal supplied to the first local oscillator and the first AD converter;
   a second measurement channel for measuring a second input signal, comprising:
     a second local oscillator for generating a second local signal;
     a second frequency mixer for mixing the second input signal to be measured with the second local signal to produce a second IF (Intermediate Frequency) signal;
     a second IF filter for allowing the second IF signal from the second frequency mixer to pass therethrough;
     a second detector for detecting a second signal representing the second input signal from the second IF filter;
     a second AD (Analog-to-Digital) converter for converting the second signal from the second detector to a second digital signal; and
     a second ramp generator for generating a second ramp signal supplied to the second local oscillator and the second AD converter;
   a demodulator for receiving one of the first IF signal from the first IF filter or the second IF signal from the second IF filter for demodulating the IF signal to generate a trigger signal to start a sweep operation of one of the second ramp generator or the first ramp generator to synchronously measure the first and second input signals by the first and second measurement channels; and
   means for processing said first and second digital signals to calculate measurement results of the first and second input signals and displaying the results.

2. A spectrum analyzer as defined in claim 1, further comprising a selector inserted between the second detector and the second AD converter, the selector selecting one of the first signal from the first detector or the second signal from the second detector and supplying the same to the second AD converter.

* * * * *